United States Patent [19]

Breit et al.

[11] Patent Number: 5,276,423
[45] Date of Patent: Jan. 4, 1994

[54] CIRCUIT UNITS, SUBSTRATES THEREFOR AND METHOD OF MAKING

[75] Inventors: Henry F. Breit, Attleboro, Mass.; James A. Forster, Barrington, R.I.

[73] Assignee: Texas Instruments Incorporated, Dallas, Tex.

[21] Appl. No.: 790,933

[22] Filed: Nov. 12, 1991

[51] Int. Cl.⁵ .............................................. H01C 1/012
[52] U.S. Cl. ................................... 338/308; 338/307; 338/314; 338/234; 338/159
[58] Field of Search ............... 338/308, 306, 307, 314, 338/234, 159; 361/406, 397, 411, 386, 400; 427/96; 174/50, 52.1

[56] References Cited

U.S. PATENT DOCUMENTS

| | | | |
|---|---|---|---|
| 3,002,044 | 9/1961 | Scoville | 174/50 |
| 3,791,863 | 2/1974 | Quirk | 338/308 |
| 4,480,013 | 10/1984 | Doi et al. | 428/616 |
| 5,119,063 | 6/1992 | Nonnenmacher et al. | 338/159 |

OTHER PUBLICATIONS

"Evaluation of Braze Processes for AlN Packages", R. Harshbarger, W. Jones, W. Jiang, and R. Zhuge, The International Journal for Hybrid Microelectronics, vol. 4, No. 1, Mar. 1991.

"Low Thermal Expansion Aluminum Alloy CMSH A-40 For Electronic Components", M. Hanada, Y. Itoh, Y. Takeda, K. Akechi, and M. Osada; Jan. 1990.

*Primary Examiner*—Marvin M. Lateef
*Attorney, Agent, or Firm*—Russell E. Baumann; Richard L. Donaldson; René E. Grossman

[57] ABSTRACT

A layer of ceramic material such as alumina is plasma-deposited on a sheet member such as molybdenum or a composite laminate of molybdenum and graphite or other material of low thermal expansion to form a circuit unit substrate having a thick, adherent, electrically-insulating coating on a light, rigid and thermally-conducting base. Thick and thin film materials are deposited and fired on the insulating coating to provide conductors, insulators or resistors or the like in a circuit unit. The materials of the sheet member and of the insulating coating are selected to have matching thermal expansion coefficients so that the substrate remains flat and free of bowing during the firing of the thick and thin film materials. The plasma-deposited electrically-insulating layer is sealed to prevent moisture absorption during use.

12 Claims, 2 Drawing Sheets

CIRCUIT UNITS, SUBSTRATES THEREFOR AND METHOD OF MAKING

BACKGROUND OF THE INVENTION

The field of the invention is that of electrical circuit units, and the invention relates more particularly to an electrical circuit unit having circuit components fired on an electrically insulating substrate of high thermal conductivity to have improved mechanical, electrical and thermal properties when subjected to high voltages and to high temperatures during manufacture and use.

Large area, low cost, electrical circuit units embodying thick and thin film circuit components and the like are frequently proposed for use in high voltage and high temperature circuit applications. Ceramic electrical insulating materials are frequently proposed for use in such circuit units to withstand the high temperatures which are required for firing thick film circuit components in such circuit units. In that regard, an electrical circuit unit of this general type is considered large if a dimension of the ceramic insulating layer in its circuit plane exceeds the thickness of the insulating layer by a multiple of 25 or more. Such circuit units also typically require dissipation of substantial amounts of heat when the circuit units are operated at their intended high voltages. Typically the use of ceramic insulating layers of larger proportions in such electrical circuit units is limited by the mechanical properties of the circuit unit substrates such as the resistance to fracture of the electrically insulating substrate layers when subjected to shock and vibration and the resistance to stresses due to differences in relative thermal expansion of the substrate materials and other circuit components when subjected to high temperature during firing of circuit components or during use, and by the thermal conductivity which is achieved in the circuit units for dissipating heat from the circuit components before heat build-up damages the circuit components. It is also difficult to provide such a ceramic insulating layer of sufficient thickness for high voltage applications on a metal layer of sufficient thickness to provide a larger area circuit unit with sufficient heat-dissipation for high voltage applications in high temperature environments.

Related subject matter is shown in the commonly assigned copending application for U.S. patent, Ser. No. 587,189.

BRIEF SUMMARY OF THE INVENTION

It is an object of this invention to provide a novel and improved electrical circuit unit; to provide a novel and improved electrical circuit unit substrate for use in such a circuit unit; to provide such an improved electrical circuit unit which is adapted to incorporate thick and thin film circuit units which are selectively fired or deposited onto ceramic, electrically-insulating materials in the circuit units; to provide such improved electrical circuit units which are of relatively large size; to provide such improved circuit units which display improved heat-dissipating properties; and to provide novel and improved methods for making such improved electrical circuit units and substrates therefor.

Briefly described, the novel and improved electrical circuit unit of the invention comprises a unit substrate having a metal sheet member and having an electrically-insulating layer of ceramic material secured to one or both broad flat side surfaces of the metal sheet member. The metal sheet member preferably comprises a layer of molybdenum or of a composite laminate having layers selected from the group of molybdenum and copper, of molybdenum and graphite, of copper and tungsten, and of copper and Invar and the like having relatively high thermal conductivity and a selected relatively low thermal expansion characteristic. Preferably the composite laminate layers are arranged to be symmetrical. The layer of electrically insulating ceramic material is preferably selected from the group consisting of alumina, beryllia and aluminum nitride having a coefficient of thermal expansion substantially the same as that of the selected metal sheet member. In accordance with the invention, an electrical circuit unit substrate is made by thermal spray depositing, as by plasma-depositing or the like, a layer of selected, ceramic, electrically-insulating material on at least one broad flat surface of the metal sheet member. That is, the ceramic material is directly sprayed at the member surface to be adhered to the surface. Plasma-deposition, for example, permits rapid formation of an insulating layer of desired thickness for high voltage applications in strongly adherent relation to the metal sheet member. Various types of plasma deposition including plasma deposition in air are used and other thermal spray techniques such as the detonation gun technique called D-Gun deposition by Union Carbide Corporation are also within the scope of the invention. Electrical circuit units such as thick film resistors and thin film conductors and the like are deposited on the ceramic electrically insulating layer of the substrate and are fired or otherwise processed thereon to be adherent to the ceramic layer. Preferably the plasma-deposited ceramic layer is then sealed to exclude moisture from the ceramic layer. In one preferred embodiment of the invention, the plasma-deposited ceramic layer is sealed after forming of the desired circuit components by depositing and firing a layer of glass over the ceramic layer of material or by infiltrating an inorganic sealing media into the structure. In another preferred embodiment, the circuit unit is mounted in a sealed housing. In another preferred embodiment, a portion of the metal sheet member is formed into a cup-shaped housing having the ceramic substrate layer disposed on the bottom inside of the cup and a metal or ceramic lid or the like is sealed to a rim of the cup-shaped housing for sealing the plasma-deposited ceramic within the housing to exclude moisture.

In that arrangement, the plasma-deposited ceramic layer is rapidly formed in adherent relation to the metal sheet member with any desired thickness to provide a circuit substrate having the desired insulation thickness to meet electrical insulating requirements for high voltage application. The metal sheet member is not significantly heated during the rapid plasma-deposition of the ceramic and thereby avoids damage to the metal sheet member such as might result in bowing of the resulting composite substrate. In addition, the coefficient of thermal expansion of the metal sheet member and ceramic electrical insulating materials are selected to be substantially the same so that the substrate is substantially free of warpage as it is formed. The plasma-deposited ceramic electrically-insulating layer is adapted to receive deposition of electrical circuit components including thick film resistors and thin film conductors in strongly adherent relation to the ceramic material and the thick film components and the like are easily fired onto the ceramic without risk of substrate warpage. Thereafter, the ceramic layer is easily sealed either by a fired glass layer, by an inorganic sealing media infiltrated into the ceramic, or by a sealed circuit unit housing. The sealing avoids absorption of moisture into the plasma deposited ceramic so that the ceramic retains its adherence and its desired electrical insulating properties during use. The electrical circuit unit is adapted to be made in a very large size and the ceramic insulating layer is supported by the metal sheet member so that it is substantially free of fracture due to shock, vibration or thermal expansion. The substrate is also adapted to dissipate large amounts of heat from the electrical circuit unit during use.

DESCRIPTION OF THE DRAWINGS

Other objects, advantages and details of the novel and improved electrical circuit unit, circuit unit substrate and methods of the invention appear in the following detailed description of preferred embodiments of the invention, the detailed description referring to the drawings in which.

DESCRIPTION OF THE PREFERRED EMBODIMENTS

Figure 2:
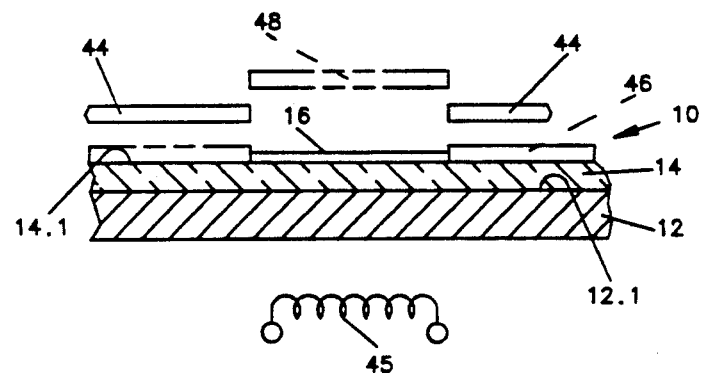
FIG. 2 is a diagrammatic side elevation view of apparatus used in carrying out an additional step in the method of the invention.
Figure 3:
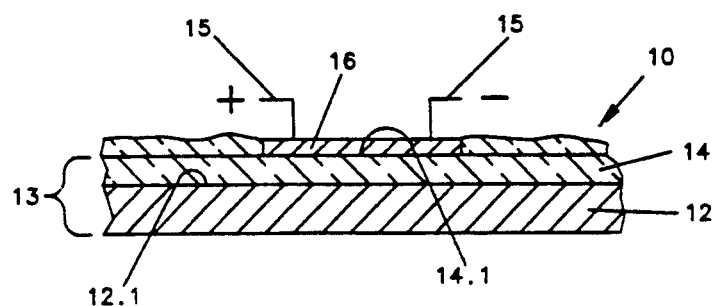
FIG. 3 is a section view to enlarged scale along a longitudinal axis of one preferred embodiment of the electrical circuit unit formed by the method illustrated in FIGS. 1 and 2.

Referring to the drawings, a preferred embodiment of the novel and improved electrical circuit unit of the invention is indicated at 10 in FIGS. 2 and 3. The circuit unit 10 as illustrated in FIG. 3 is shown to include a metal sheet member 12, a ceramic electrically insulating layer 14 adhered to one side 12.1 of the metal sheet member to form a circuit substrate 13, and electrical circuit component means 16 disposed on one side 14.1 of the electrically insulating layer to form the circuit unit. The circuit component means 16 are of any conventional type including solid state or other discrete devices, integrated circuits, circuit path means interconnecting other circuit components, terminals and thick or thin film resistors elements and the like formed in situ by firing on the insulating layer. For simplicity of illustration only a single circuit component such as a thick film resistor element 16 is shown in FIG. 3 but it will be understood that any of various circuit components are used in the circuit unit 10 to be electrically connected in an electrical circuit as indicated diagrammatically at 15 in FIG. 3.

The metal sheet member 12 used in the circuit unit is selected to be relatively strong and rigid to provide support for the circuit unit and to display substantial thermal conductivity to serve as heat-sink or heat-dissipating means to withdraw heat from the circuit component 16 when the circuit unit 10 is operated in an electrical circuit, thereby to prevent damage to the components by overheating. The electrically insulating layer 14 electrically insulates the component means 16 from the metal sheet member.

Figure 1:
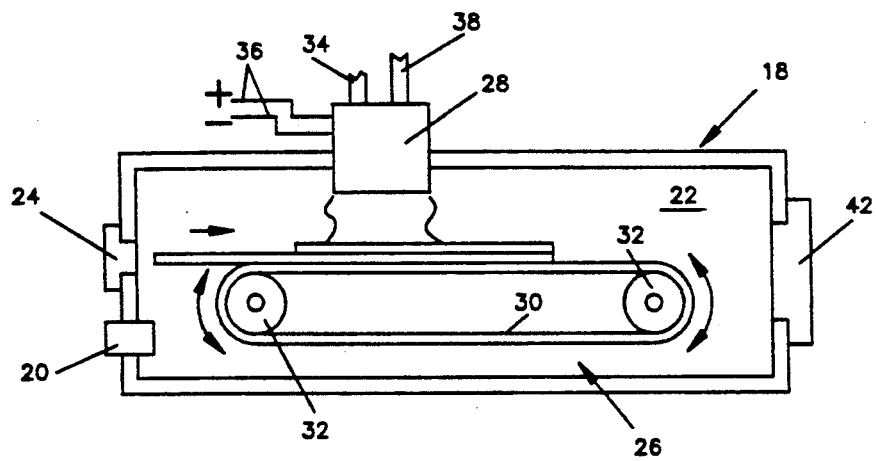
FIG. 1 is a diagrammatic side elevation view of apparatus used in carrying out a step in the method of the invention.

In accordance with the present invention, the ceramic electrically insulating layer 14 is provided in the circuit unit 10 by thermal spray deposition of ceramic material onto a metal sheet member 12. Any thermal process such as detonation gun deposition which directly sprays ceramic material onto the metal sheet member to achieve a dense adherent coating is adapted to be used within the scope of the invention. Preferably, for example, a typical and conventional plasma-deposition apparatus 18 is arranged as diagrammatically illustrated in FIG. 1. The plasma-deposition apparatus includes a pump means 20 for establishing and maintaining a selected very low pressure or vacuum condition in a chamber 22 in the apparatus. A removable seal or plug 24 permits a metal sheet member 12 to be inserted into the apparatus chamber 22 and a conveyor means 26 is arranged to receive the sheet member and to advance it through the chamber past a conventional plasma-deposition gun 28. Preferably, for example, a continuous belt 30 receives the sheet member and moves it rapidly back and forth across the chamber past the gun as the belt is moved by driving rolls 32. The plasma-deposition gun has tube means 34 arranged to feed a continuous stream of ceramic particles into the gun 28 in a conventional carrier gas, has electrical power input means 36 to the gun adapted to generate temperatures of 10,000° C. and above as is customarily required for plasma deposition, and has additional tube means 38 circulating coolant means through the deposition gun to protect the gun from the high plasma deposition temperatures. The plasma apparatus is arranged to deposit multiple thin layers of a ceramic electrically insulating material directly on the metal sheet member 12 to build up a selected thickness as is diagrammatically indicated at 40 in FIG. 1. The coated sheet member is then removed from the apparatus via the removable plug or seal means 42. It will be understood that although the described plasma-deposition apparatus is diagrammatically illustrated, any conventional plasma deposition apparatus is adapted to be used within the scope of the invention. In that regard, plasma deposition in air is also adpated to be used and provides definite economic advantages. It will be understood that such apparatus achieves very high deposition temperatures but achieves them in such a localized manner that the amount of heat transferred to the metal sheet member is relatively limited. Typically, for example, the metal sheet member temperatures do not exceed 300° C. during the plasma-deposition process although higher temperatures are also used to enhance adhesion.

In that way, the electrically insulating layer 14 is easily established in strongly adherent relation to the metal sheet member 12 to form the novel substrate unit 13. Most important, the insulating layer is easily deposited with layer thicknesses of from 0.0005 to 0.005 inches or more as desired to provide the insulating layer with reliable dielectric strength from a few hundred to 3000 volts or more as is required for many higher voltage electrical circuit unit applications at the present time. If desired, mask means are used for selectively depositing the ceramic on limite portions. A conventional thick film resistor-element 16 of ruthenium oxide or the like is easily deposited on the electrically insulating layer 14 in any conventional manner as is diagrammatically indicated by the mask means 44 in FIG. 2 and is fired on the ceramic layer in conventional manner as diagrammatically indicated by the heater 45 in FIG. 2. Typically such thick film resistors are fired at temperatures on the order of 850° C. to 1000° C. Where molybdenum or copper sheet metals are used, the firing is typically done in a nitrogen or other protective atmosphere to prevent excessive oxidizing of the sheet member. If desired thick film conductors and other circuit elements are also formed in situ on the plasma-deposited electrically insulating layer 14. The deposited and fired thick and thin film elements 16 and the like are strongly adherent to the insulating layer 14. The plasma-deposited ceramic insulating layer 14 has some hygroscopic properties but in one preferred embodiment of the invention, a glass sealant indicated at 46 in FIGS. 2 and 3 is deposited over the electrically insulating layer 14 in any conventional manner as is diagrammatically illustrated by the mask means 48 in FIG. 2. Alternately, the sealing material is also deposited to further extend over the circuit component means 16 as will be understood. If desired, an inorganic sealing media is infiltrated into the plasma-deposited ceramic.

The circuit unit substrates 13 are adapted to be formed by plasma-deposition of the insulating layer on metal sheet members which have been previously cut to desired size but preferably the circuit unit substrates are cut from a larger plasma-coated metal sheet member. If desired, a strip of the metal sheet member material is fed from a reel past a plasma-deposition gun in any conventional manner to receive an insulating coating, is taken up on a storage reel, and is subsequently fed from the storage reel to have circuit components formed and/or mounted thereon by automatic means in otherwise conventional process steps.

The ceramic materials used in forming the electrically insulating layer 14 preferably comprise alumina, beryllia or aluminum nitride or the like to display relatively low thermal expansion properties. Alumina, beryllia and aluminum nitride have coefficients of thermal expansion of 6.5 ppm/°C., 6.7 ppm/°C. and 3.5 ppm/C° respectively. Preferably the ceramic materials are provided to the plasma-deposition apparatus in particle size in the range from 10 to 40 microns and preferably a particle carrier gas of argon is used in the plasma-deposition.

The metal sheet member 12 is preferably formed of a metal material such as molybdenum or aluminum or the like having high thermal and electrical conductivity. However, where a thick film component such as a resistor is to be deposited on the insulating layer, the metal sheet member material is selected to display relatively low thermal expansion substantially matching the thermal expansion properties of the electrically insulating layer 14. In a preferred embodiment of the invention as shown in FIG. 3, the metal sheet member 12 is formed of molybdenum having a thickness in the range from 0.010 to 0.100 inches and the insulating layer is formed of alumina. The molybdenum has a thermal expansion coefficient of 5.5 ppm/°C. and has a conductivity of 140+Wm (watt meter)/°K. while alumina has a thermal conductivity of 20 Wm/°K. With such circuit substrate components, circuit substrate sizes up to 12×12 inches are achieved and are adapted to have thick film resistors 16 fired thereon at temperatures on the order of 950° C. without bowing.

Figure 4:
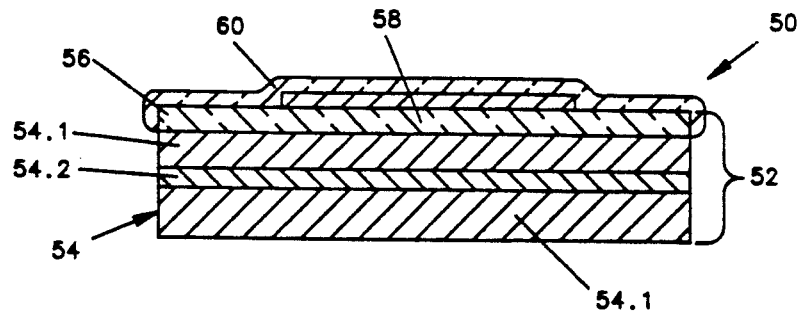
FIG. 4 is a section view similar to FIG. 3 illustrating another preferred embodiment of the electrical circuit unit formed in accordance with the methods of the invention.

In another preferred embodiment of the electrical circuit unit of the invention as shown at 50 in FIG. 4, the circuit substrate 52 comprises a composite metal sheet member 54 having an electrically insulating layer 56 as previously described plasma-deposited thereon. Circuit component means 58 such as a thick film resistor is fired thereon and a glass sealant 60 is coated over the circuit components and over the plasma-deposited coating, including the edges thereof, for sealing the insulating coating to exclude moisture. The composite metal sheet member 54 typically comprises a composite metal laminate of molybdenum 54.1 and copper 54.2, of molybdenum 54.1 and tungsten 54.2, of tungsten 54.1 and copper 54.2, and of copper 54.1 and Invar 54.2, the layer materials and relative thicknesses in the composite metal being selected relative to the material of the insulating coating 56 to display substantially the same thermal expansion coefficient as the coating. In one preferred embodiment of the invention, the metal sheet member 54 is formed of molybdenum and graphite composite material as shown in commonly assigned, co-pending application for U.S. patent, Ser. No. 397,060 filed Aug. 21, 1989, the disclosure of which is incorporated herein by this reference. The composite has outer layers 54.1 of molybdenum secured to a core layer 54.2 of graphite by use of thin, intermediate bonding layers of titanium along the composite interfaces 54.3.

Figure 5:
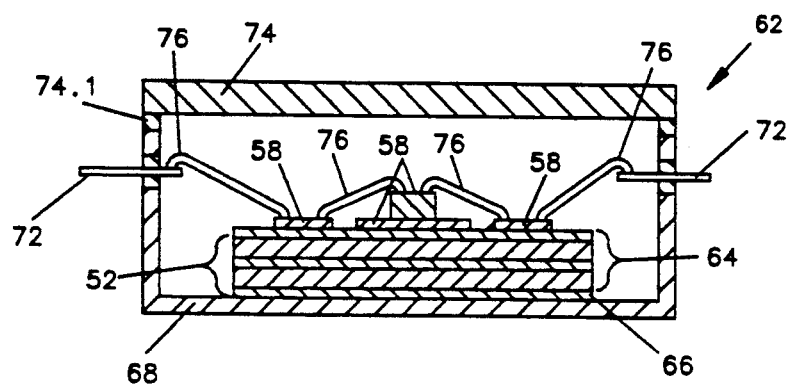
FIG. 5 is a section view to enlarged scale along a longitudinal axis of another preferred embodiment of the electrical circuit unit provided by the invention.

In another preferred embodiment of the electrical circuit unit of the invention as shown at 62 in FIG. 5, a circuit substrate 52 having circuit component means 58 thereon as previously described with reference to FIG. 4 is prepared free of the glass sealing coating 60 to form a sub-unit 64. The sub-unit is then secured by solder or brazing or the like as at 66 on the inside bottom of a cup-shaped metal housing 68 of Kovar or the like having thermal expansion properties corresponding to the metal sheet member 54, and the circuit components are connected by wires 76 to lead pins 72 extending in electrically insulated relation to walls of the housing. A metal lid 74 is brazed to the housing rim at 74.1 to seal the unit. In that arrangement, the mounting of the plasma-deposited coating 56 inside the sealed housing excludes moisture from the coating without requiring use of the glass sealant.

Figure 6:
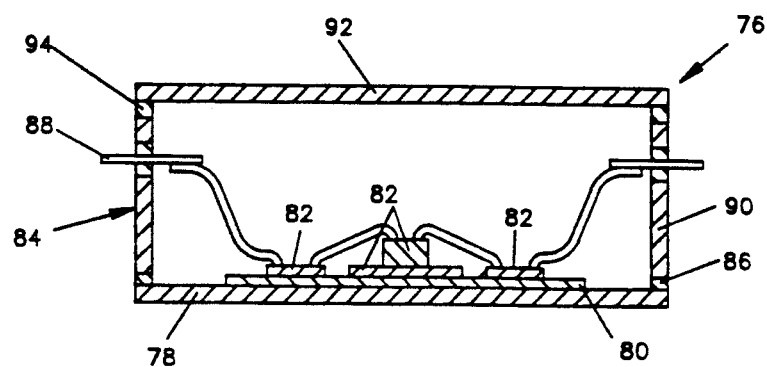
FIG. 6 is a section view similar to FIG. 5 illustrating another preferred embodiment of the electrical circuit unit of the invention.

In another preferred embodiment of the electrical circuit end of the invention as shown in 76 in FIG. 6, a metal sheet member 78 as above described is provided with a plasma-deposited insulating coating 80 as above described. Preferably the coating is restricted to the central portion of the metal sheet member as shown by suitable masking means. Circuit component means 82 are mounted on the insulating coating as above described and the metal sheet member is then brazed to a cup-shaped metal sealing housing 84 as indicated at 86. Preferably, for example, the components are connected to lead pins 88 in a housing ring 90 as above described and a lid 92 is brazed to the ring as at 94. In that way, the sealing glass is not required for excluding moisture from the plasma-deposited coating 80.

It should be understood that although particular embodiments of the invention have been described by way of illustrating the invention, the invention includes all modifications and equivalents of the disclosed embodiments falling within the scope of the appended claims:

We claim:

1. A method for making a substrate for an electrical circuit unit incorporating at least one thick film element comprising the steps of providing a sheet member of a metal material of a selected coefficient of thermal expansion having a side surface, and plasma-depositing inorganic electrically insulating material of a selected coefficient of thermal expansion which is substantially the same as the coefficient of thermal expansion of the metal material on the member side surface to bond the inorganic material to the member and provide an electrically insulating layer of the inorganic material of selected thickness on the member side surface in which bowing and cracking of the sheet member and layer are prevented during the firing of the at least one thick film element due to the coefficient of thermal expansion matching.

2. A method for making an electrical circuit unit incorporating a thick film electrical component comprising the steps of providing a sheet member of metal material of a selected coefficient of thermal expansion having a side surface, plasma-depositing inorganic electrically insulating material of a selected coefficient of thermal expansion which is substantially the same as the coefficient of thermal expansion of the metal material on the member side surface to bond the inorganic material to the member and provide an electrically insulating layer of the inorganic material of selected thickness of the member side surface, depositing thick film electrical component material in a selected pattern on the electrically insulating layer, and firing the thick film electrical component material on the electrically insulating layer at a temperature up to 1000° C. to form a thick film electrical component in which bowing and cracking of the sheet member and layer are prevented during the firing due to the coefficient of thermal expansion matching.

3. A method according to claim 2 wherein the metal material of the sheet member is selected from the group consisting of molybdenum and composite laminate materials of molybdenum and copper, of molybdenum and tungsten, of molybdenum and graphite, of tungsten and copper, and of copper and Invar.

4. A method according to claim 3 wherein the inorganic electrically insulating material is selected from the group consisting of alumina, beryllia and aluminum nitride.

5. A method according to claim 2 further comprising the steps of firing a glass material over the electrically insulating layer of inorganic material for sealing the layer against moisture.

6. A substrate for an electrical circuit unit incorporating at least one thick film element comprising the product resulting from the process of providing a sheet member of a metal material of selected coefficient of thermal expansion having a side surface, and plasma-depositing inorganic electrically insulating material of a selected coefficient of thermal expansion which is substantially the same as the coefficient of thermal expansion of the metal material on the member side surface to bond the inorganic material to the member and provide an electrically insulating layer of the inorganic material of selected thickness on the member side surface in which bowing and cracking of the sheet member and layer are prevented during the firing of the at least one thick film element due to the coefficient of thermal expansion matching.

7. An electrical circuit unit incorporating a thick film electrical component comprising the product resulting from the process of providing a sheet member of metal material of a selected coefficient of thermal expansion having a side surface, plasma-depositing inorganic electrically insulating material of a selected coefficient of thermal expansion which is substantially the same as the coefficient of thermal expansion of the metal material on the member side surface to bond the inorganic material to the member and provide an electrically insulating layer of the inorganic material of selected thickness on the member side surface, depositing thick film electrical component material in a selected pattern on the electrically insulating layer, and firing the thick film electrical component material on the electrically insulating layer up to a temperature of 1000° C. to form a thick film electrical component in which bowing and cracking of the sheet member and layer are prevented during the firing due to the coefficient of thermal expansion matching.

8. An electrical circuit unit according to claim 7 wherein the metal material of the sheet member is selected from the group consisting of molybdenum and composite laminate materials of molybdenum and copper, of molybdenum and tungsten, of molybdenum and graphite, of tungsten and copper and of copper and Invar.

9. An electrical circuit unit according to claim 8 wherein the inorganic electrically insulating material is selected from the group consisting of alumina, beryllia and aluminum nitride.

10. An electrical circuit unit according to claim 9 wherein the process further comprises the step of firing a glass material over the electrically insulating layer of inorganic material for sealing the layer against moisture.

11. An electrical circuit unit comprising the product resulting from the process of providing a sheet member of metal material having a side surface, the metal material being selected from the group consisting of molybdenum and composite laminate materials of molybdenum and copper, of molybdenum and tungsten, of molybdenum and graphite, of tungsten and copper and of copper and Invar, plasma-depositing inorganic electrically insulating material selected from the group consisting of alumina, beryllia and aluminum nitride on the member side surface to bond the inorganic material to the member and provide an electrically insulating layer of the inorganic material of selected thickness on the member side surface, depositing thick film electrical component material in a selected pattern on the electrically insulating layer, firing the thick film component material on the electrically insulating layer at a temperature up to 1000° C. to form a thick film electrical component, the metal material of the sheet member and the inorganic material of the electrically insulating layer being selected to be of substantially the same coefficient of thermal expansion to substantially prevent bowing of the sheet member and layer during said firing, and sealing the electrically insulating layer within a housing.

12. An electrical circuit unit according to claim 11 wherein the housing has a cup-shape, the sheet member is secured in thermally conducting relation to a bottom of the housing within the cup shape, and a lid is sealed to a rum of the cup-shape around an open end of the cup-shape for sealing the electrically insulating layer within the housing.

* * * * *